United States Patent [19]

Bi et al.

[11] Patent Number: 4,958,225

[45] Date of Patent: Sep. 18, 1990

[54] FULL-SEARCH-EQUIVALENT METHOD FOR MATCHING DATA AND A VECTOR QUANTIZER UTILIZING SUCH METHOD

[75] Inventors: Qi Bi, Philadelphia, Pa.; Gardiner S. Stiles, Providence; Chien M. Huang, Logan, both of Utah

[73] Assignee: Utah State University Foundation, Logan, Utah

[21] Appl. No.: 363,554

[22] Filed: Jun. 9, 1989

[51] Int. Cl.$^5$ .............................................. H04N 7/18
[52] U.S. Cl. ................................... 358/133; 358/135; 341/106
[58] Field of Search ............... 358/133, 135, 136, 105; 375/122; 341/106

[56] References Cited

U.S. PATENT DOCUMENTS

| | | |
|---|---|---|
| 4,558,350 | 12/1985 | Murakami . |
| 4,560,977 | 12/1985 | Murakami et al. . |
| 4,727,354 | 2/1988 | Lindsay . |
| 4,800,425 | 1/1989 | Schwerzel et al. ............... 358/136 |
| 4,809,300 | 2/1989 | Goldstein et al. ................ 375/27 X |
| 4,811,265 | 3/1989 | Hashimoto et al. ............... 341/106 |
| 4,837,632 | 6/1989 | Kubo et al. ...................... 358/136 X |
| 4,845,559 | 7/1989 | Labit et al. ...................... 358/135 X |
| 4,853,779 | 8/1989 | Hammer et al. ................. 358/135 X |

OTHER PUBLICATIONS

B. H. Juang and A. H. Gray, "Production Code Vector Quantization For Speech Coding", *Proc. IEEE Int Conf ASSP*, pp. 597-560, Apr. 1982.

M. J. Sabin and R. M. Gray, "Production Code Vector Quantizers For Speech Waveform Coding", *Conf Record Globe Com 1982*, pp. 1087-1091, Dec. 1982.

Andres Buzo, A. H. Gray. Jr., R. M. Gray, and J. D. Markel, "Speech Coding Based Upon Vector Quantization", IEEE Trans. on ASSP, pp. 562-574, Oct. 1980.

R. M. Gray, "Vector Quantization", IEEE ASSP Mag., pp. 4-29, Apr. 1984.

M. J. Sabin and R. M. Gray, "Product Code Vector Quantizers For Waveform and Voice Coding", IEEE Trans. on ASSP, pp. 474-488, Jun. 1984.

*Primary Examiner*—James J. Groody
*Assistant Examiner*—Victor R. Kostak
*Attorney, Agent, or Firm*—Venable, Baetjer, Howard & Civiletti

[57] ABSTRACT

A method for compressing data employing vector quantization is achieved by calculating the norm of an input vector and identifying a reference codebook vector which has a norm which is closest to the norm of the input vector. The distance between the input vector and the reference codebook vector selected is computed and employed to identify a vector space about the reference vector containing a subset of codebook vectors one or more of which may be closer to the input vector than the initially selected reference vector. The closest codebook vector is selected iteratively without the necessity of searching every vector in the codebook.

23 Claims, 8 Drawing Sheets

FULL-SEARCH-EQUIVALENT METHOD FOR MATCHING DATA AND A VECTOR QUANTIZER UTILIZING SUCH METHOD

BACKGROUND OF THE INVENTION

The invention relates generally to a method for searching a set of elements to identify one which closely matches a reference. More specifically, the invention relates to a vector quantizer which utilizes such a method to compress video data.

Numerous fields of endeavor make use of vector processing. One newly emerging application is data compression. The preferred embodiment of the invention will be described with particular reference to compression of image signals, though such an illustration is not a limitation on its scope.

A quantizer is a device which represents one signal which can take on a large number of values by another signal which can take on only a limited number of values. A four bit analog-to-digital converter, for example, represents the value of a continuously varying (i.e., analog) signal by a digital signal which can have only one of sixteen values. Scalar quantizers operate on signals having a single degree of freedom, such as an analog-to-digital converter operating on a voltage signal. Vector quantizers operate on signals having multiple degrees of freedom as will be discussed more fully below.

A vector quantizer for compressing video images conceptually divides the image into numerous small areas called pixels (a term formed from the words "picture" and "element"). Pixels are sufficiently small that the intensity of the image is approximately constant across the pixel area. For example, a black and white image of a house might be divided into a grid of 600 rows and 600 pixels per row. Each pixel would be like a small dot in the image. A group of pixels together would form a vector which can be thought of as a small subimage. For example a 6×6 square patch of pixels forms a vector which may be a portion of a shadow, or part of the roof line against a light background. Vectors formed from an image shall be called image vectors. The circuit of the present invention operates on vectors which, for the illustrated example, are image vectors. In general, any source of vector signals may be used, and vectors which are subject to quantization are more generally referred to as input vectors.

While a black and white image serves as an example here, vectors might also be formed from red, green, or blue levels from a color image. They might also be formed from Y,I and Q components of a color image, or from transform coefficients of an image signal on which a Hadamard, Fourier, or other transform has operated.

Numerous methods exist for manipulating an image to form image vectors. For example, a television camera might generate an analog video signal in a raster scan format having 600 scan lines per frame. An analog-to-digital converter could then digitize the video signal at a sampling rate of 600 samples per scan line. Digital signal processing equipment can then store the digital samples, and group them into vectors. The process of digitizing an analog video signal is a form of scalar quantization which is similar to but distinct from methods of vector quantization. The discussion which follows assumes that one of many methods well known in the art of signal processing can be used to produce digital image signals.

Before quantizing an image, a vector quantizer stores a set of "codebook" vectors in memory. Codebook vectors are vectors which are chosen to be representative of commonly found image vectors. For example, one codebook vector might be a 6×6 pixel solid black patch. Another codebook vector might have all white pixels in the top three rows, and all black pixels in the bottom three rows. Yet another codebook vector might have a gradient made up of white pixels in the top row, black pixels in the bottom row, and four rows in between having shades of grey which go from light to dark. The quantizer stores a sufficient variety of codebook vectors so that at least one closely matches each of the many vectors that might be found in the full image.

Each codebook vector is assigned a unique identification code. The solid black patch, for example, might be assigned ID code #1. The codebook vector having white pixels in the top half and black pixels in the bottom half might be assigned ID code #2, and so on for hundreds or thousands of codebook vectors. The set of all codebook vectors is called a codebook.

When quantizing a full image, a vector quantizer divides the full image into a series of image vectors. For each image vector, the vector quantizer identifies one closely matching codebook vector. The vector quantizer then generates a new signal made up of the series of the identification codes of the selected codebook entries. For the example of a full image of a house, the vector quantizer would divide the full image into numerous image vectors. The quantizer might then replace image vectors from shadow areas with ID code #1 (the solid black patch), and it might replace roof line image vectors with ID code #2 (white in the top half and black in the bottom half).

Regeneration of the full image can be accomplished by a device which has the complete codebook stored in memory. The device regenerates the image signal by replacing each ID code in the quantized signal with its corresponding codebook vector. The process is similar to "painting by the numbers." The regenerated image differs from the original image, because codebook entries do not precisely match the original image vectors. The difference is called distortion. Increasing the number of codebook entries decreases distortion.

In mathematical terms, a vector quantizer is a device which maps vectors from a vector space onto a finite set. A pixel from a black and white image is a scalar, because the pixel has only one degree of freedom: intensity. A 6×6 square patch of pixels is a vector, because the square patch has numerous degrees of freedom: the intensities of each of the thirty six pixels. The set of all possible image vectors forms a vector space.

Conceptually, the vector space can be partitioned into a finite number of regions. One vector from each region can be designated as a codebook vector for that region. All possible image vectors exist somewhere in the vector space. Each possible image vector thus lies within one of the regions. In fact, multiple image vectors might occupy the same region. For all image vectors in a given region, the vector quantizer replaces the image vector with an identification code for that region. The vector quantizer thus maps all vectors of the vector space onto a set of identification codes. When regenerating the image, each identification code is replaced with the codebook vector for the corresponding region.

Vector quantizers are developing as useful devices for compressing data. A compressor, as the term is used here, is a device which represents one signal by a second signal from which the original can be derived, but which requires the transmission or recording of less information than the original signal. For example, digitally transmitting a full image ordinarily requires transmitting the intensities of each pixel of each row of the full image. A vector quantizer instead transmits an ID code for each image vector.

A vector quantizer sends fewer bits than would otherwise be sent, because one ID code is a smaller number of bits than all the pixel intensities of the image vector. Suppose, for example, that each pixel intensity in an image is represented by an eight bit binary number (eight bits allows definition of 256 levels of intensity for each pixel). Suppose also that image vectors are made up of thirty six pixels. A vector could thus be represented by 288 bits (8 bits/pixel times 36 pixels equals 288 bits). In addition, suppose that a codebook contains 1024 entries. (Experience has shown that reasonable image quality can be achieved with a codebook of 1024 vectors.) Each of the 1024 entries can by uniquely designated by a ten bit identification code. By replacing each image vector with identification code of a codebook vector, a vector quantizer replaces 288 bits with 10 bits.

Some vector quantizers utilize computers to store codebook vectors in memory. They then employ some form of software program to search the memory for a match between an image vector and a codebook vector. Identifying the codebook vector which most closely matches an image vector requires a significant number of computational steps. It is known that computing devices perform mathematical operations in steps. The binary sum of two numbers may, for example require one or more steps. A multiplication of two numbers may require a greater number of steps. Computing the square root of a number may require an even greater number. The number of computational steps needed to match an input vector to a codebook vector is thought to increase linearly with the number of codebook entries. This has created limitations with such quantizers. The lengthy time required to perform the computational steps forces designers to sacrifice image quality for speed, because they must use small codebooks, or vectors of small dimension. Alternatively some designers resort to complicated signal processing in advance of vector quantization in order to reduce the amount of information which must be quantized.

A full codebook search is an example of one straightforward method for selecting the best match between an image vector and the codebook entries. The vector quantizer sequentially compares an input image vector to each and every codebook vector. The vector quantizer computes a measure of distortion for each codebook vector and selects the one having the smallest distortion. A full codebook search ensures selection of the best match (a property called optimality), but involves the maximum number of computational steps. The article by Y. Linde, A. Buzo and R. Gray entitled "*An Algorithm for Vector Quantizer Design*," IEEE Transactions on Communications, Vol. Com-28, No. 1 (Jan. 1980) describes the full codebook search and the computational steps involved in such a search.

A technique known as a branching search reduces the number of codebook entries which must be evaluated, but does not necessarily identify the best match. Murakami U.S. Pat. Nos. 4,558,350 and 4,560,977 disclose vector quantizers using branching searches. The article by R. Gray and Y. Linde entitled "*Vector Quantizers and Predictive Quantizers for Gauss-Markov Sources*," IEEE Transactions on Communications, Vol. Com-30, No. 2 (Feb. 1982) describes the branching tree search and some of its shortcomings.

The vector quantizer described in Lindsey U.S. Pat. No. 4,727,354 reduces the number of computational steps required to match an input to a codebook vector by eliminating the computation of distortion. The distortion between each codebook vector and all possible input vectors is calculated in advance and stored in memory. Such a method requires large amounts of memory relative to other methods.

SUMMARY OF THE INVENTION

A method for searching a set of codebook vectors from a vector space in order to find one codebook vector which most closely matches an input vector is disclosed. A reference codebook vector is identified whose norm most nearly equals the norm of the input vector. The distance between the reference codebook vector and the input vector is computed. A subset of codebook vectors is formed from a limited region in the vector space around the input vector and the representative codebook vector. The subset of codebook vectors is searched to identify one codebook vector of the subset which best or closely matches the input vector. The limited region in the vector space may be deliniated by a fixed distance from the reference codebook vector, by a range of norms about the input vector, or by other criteria. An apparatus is described using the method for compression of video images. The method may be used to search any set of representative elements to identify one representative element which closely matches an input element.

DETAILED DESCRIPTION OF THE PREFERRED EMBODIMENT

Figure 2:
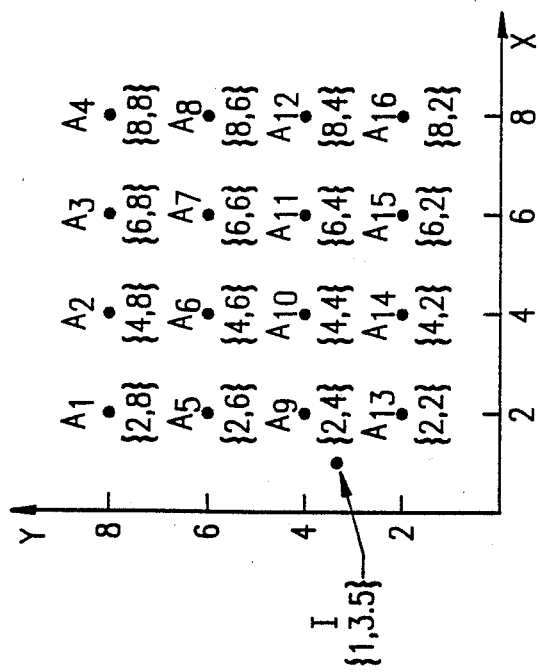
FIG. 2 is a graphic representation of codebook vectors and an image vector in a two dimensional space.

The detailed description of the preferred embodiment contains three parts. First, a theory of the search operation provides a conceptual description of the search method. Second a system description provides an overall view of an application of the invention to the compression, transmission and regeneration of video images. Finally, two alternative systems for storing quantized images are shown.

THEORY OF THE SEARCH

The discussion which follows makes use of mathematical concepts and notations from the field of vector algebra. Such notations provide precise and widely understood terms which are best suited to disclosing the operation of the invention.

TERMS & NOTATIONS

Scalar: A single value. Scalars shall be denoted by lower case letters (sometimes with subscripts). For example, a scalar may be designated as "a" or as "$a_1$".

Vector: An ordered set of scalars. Vectors shall be denoted by upper case letters (sometimes with subscripts). For example, a vector may be designated as "A" or "$A_1$". The dimension of a vector is the number of scalar elements in the ordered set. Vectors may also be denoted by listing its scalars in brackets. For example, a two dimensional vector may be designated as "$\{a_1, a_2\}$". A set of vectors shall be designated by an underlined capital letter. For example, a set of codebook vectors may be designated as S.

Norm: A scalar which is a measure of the magnitude of the vector. The norm of a vector shall be denoted by an upper case letter (which designates the vector) between vertical bars. For example, for a vector $A=\{a_1, a_2\}$, the norm of A is a scalar $h_a$ i.e., $$|A|=h_a$$

Unless otherwise noted, the norm of a vector may be calculated as sum of the absolute values of the scalar values of a vector, e.g.:

$$|A|=h_a=|a_1|+|a_2|.$$

Vector Sum: A vector sum is itself a vector whose scalar elements are the sum of the corresponding elements of two vectors. For example, for two vectors $A=\{a_1, a_2\}$ and $B=\{b_1, b_2\}$ the sum of A and B is a vector C, i.e.:

$$A+B=C=\{c_1, c_2\}=\{(a_1+b_1), (a_2+b_2)\}.$$

Vector Difference: A vector difference is itself a vector whose scalar elements are the differences of the corresponding elements of the two vectors. For example, for two vectors $A=\{a_1, a_2\}$ and $B=\{b_1, b_2\}$ the difference between A and B is a vector E, i.e.:

$$A-B=E=\{e_1, e_2\}=\{(a_1-b_1), (a_2-b_2)\}.$$

Distance: A scalar which is the norm of the vector difference between the two vectors. Distance shall be denoted by the small case letter d followed by two vectors in parenthesis. For example, for two vectors $A=\{a_1, a_2\}$ and $B=\{b_1, b_2\}$, the distance between A and B shall be a scalar h written as:

$$d(A,B)=h_{A,B}=|A-B|$$

For the purpose of this discussion, the norm is taken as the sum of the absolute values of the scalar elements of the distance vectors. Written another way:

$$d(A,B)=h_{A,B}=|A-B|=|(a_1-b_1)|+|(a_2-b_2)|.$$

The distance might alternatively be one of the well known Eucliden Norms, such as square root of the sum of the squares of the differences of the scalar elements of the vectors. Written another way:

$$d(A,B) = h_{A,B} = \sqrt{(a_1 - b_1)^2 + (a_2 - b_2)^2}$$

The following definitions are also included here for convenience.

Codebook Vector: A vector which is representative of a region of a vector space.

Input Vector: A vector which serves as input data to a vector quantizer.

Image Vector: A vector formed from image data.

Measure: An operator which provides a unit of comparison, e.g. distance or magnitude.

Representative Element: An element of a set which is representative of a subset of elements from the set (e.g. a codebook vector is representative of a subset of all possible vectors).

Input Element: An element which serves as an input to a processor which matches the input element to a representative element (e.g. an input vector is an input to a vector quantizer).

Figure 1:
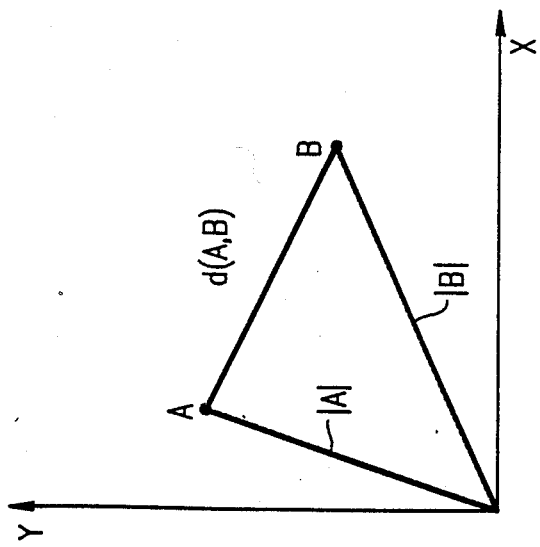
FIG. 1 is a graphic representation of vectors in a two dimensional space.

FIG. 1 shows a graphic representation of vectors in a two dimensional space. Two axes X,Y identify the two dimensions. Two vectors are denoted as points A,B. The norms of each vector A,B are conceptually the magnitudes of line segments $|A|,|B|$ connecting the vectors A,B to the origin. The distance between the two vectors A,B is conceptually the magnitude of a line segment d(A,B) connecting the two points A,B. Two dimensional vectors are shown here for ease of illustration. In practice, vectors may have higher dimensions.

THE SEARCH METHOD

The search method of the present invention is used to identify one of a set of codebook vectors which most closely matches an input vector. Briefly stated, the method for searching the codebook encompasses the following steps for each input vector:

(1) compute a norm or other characteristic measure of the input vector I, (2) identify a reference codebook vector $A_j$ having a norm which is closest to the norm of the input vector I, (3) compute the distance $h_{I,j}$ between the input vector I and the reference codebook vector $A_j$, (4) identify a subset S of the codebook vectors made up of codebook vectors from a limited volume of the vector space around the input vector I, such as vectors having a norm in the range $|I|-h_{I,j}$ to $|I|+h_{I,j}$.

(5) search the subset S for the codebook vector having the smallest distance to the input vector.

(6) select the codebook vector having the smallest distance to the input vector.

The steps are best explained by way of example. Consider a two dimensional vector space consisting of vectors whose scalar elements have positive values less than or equal to eight. Such a space can be visualized as the region between two coordinate axis X,Y as shown in FIG. 2. Consider also a set of 16 codebook vectors $A_i$ which are uniformly distributed throughout the space. (In practice, codebook vectors need not be uniformly distributed, but a uniform distribution simplifies the explanation of the search method.) Vector $A_9$, for example, has scalar values $\{2,4\}$, vector $A_{13}$ has scalar values $\{2,2\}$ and so on. Consider also an input vector I having scalar values $\{1,3.5\}$. The purpose of the search is to identify the codebook vector $A_i$ which is closest to the input vector I.

Step 1 involves computing the norm of the input vector I. The norm is defined as:

$$|A|=h_a=|a_1|+|a_2|.$$

The scalar values of I are $\{1,3.5\}$, therefore, the norm of I is 4.5.

A characteristic measure other than the norm may be used to obtain a first measure of an input vector I. The characteristic measure may, for example, be the angle made by the input vector with a reference vector, or the distance of the input to some other reference vector. The description which follows utilizes the sum of the scalar elements of the vector, because such a characteristic measure can be quickly computed with simple circuitry. Other measures can be used and still fall within the scope of the invention.

Step 2, identifying the reference codebook vector $A_j$ which has a norm closest to the input vector, selects a reference codebook vector for the search method. The reference codebook vector need not necessarily be the codebook vector with the closest norm. A vector with a close norm (e.g., less than a threshold) may also provide a satisfactory reference codebook vector. The criteria need only identify a reference codebook vector which is in some way close to the input vector.

As an aid to identifying the reference codebook vector $A_j$, the norms of all codebook entries can be calculated in advance and stored in memory. Table I represents the contents of a such a memory.

TABLE 1

| Vector | $A_j$ |
|---|---|
| $A_1$ | 10 |
| $A_2$ | 12 |
| $A_3$ | 14 |
| $A_4$ | 16 |
| $A_5$ | 8 |
| $A_6$ | 10 |
| $A_7$ | 12 |
| $A_8$ | 14 |
| $A_9$ | <u>6</u> |
| $A_{10}$ | 8 |
| $A_{11}$ | 10 |
| $A_{12}$ | 12 |
| $A_{13}$ | <u>4</u> |
| $A_{14}$ | <u>6</u> |
| $A_{15}$ | 8 |

TABLE 1-continued

| Vector | $A_j$ |
|---|---|
| $A_{16}$ | 10 |

NOTE:
$A_{13} = \{2, 2\}$
$|A_{13}| = (2 + 2) = 4$

Codebook vector $A_{13}$ has a norm of 4.0, which is closest to the 4.5 value of the norm of the input vector I. The reference codebook vector $A_j$ is thus $A_{13}$. Table look-up procedures avoid the need to compute the norms of codebook vectors during the search and are therefore fast.

This "first approximation" only compares the norm of the input vector with the norms of codebook vectors. It does not compute a measure of distance between the two. The selected codebook vector may not be the closest, because the directions of the two vectors may not be the same, even if the magnitudes are.

Step 3, computing the distance $h_{I,j}$ between the input vector I and the reference codebook vector $A_j$, provides a measure of distance for use in step 4. Distance was defined as:

$$d(A,B)=|A-B|=|(a_1-b_1)|+|(a_2+b_2)|.$$

The scalar values of I are $\{1,3.5\}$, and the scalar values of $A_{13}$ are $\{2,2\}$ (as can be seen by inspection of FIG. 2). The value of $h_j=d(I,A_{13})$ is thus 2.5:

$$d(I,A_{13})=h_{I,13}=|(1-2)|+|(3.5-2)|=2.5$$

By knowing the distance between the input vector and the reference codebook vector $A_j$, the search need only look at codebook vectors which might be closer than this measure.

Figure 5:
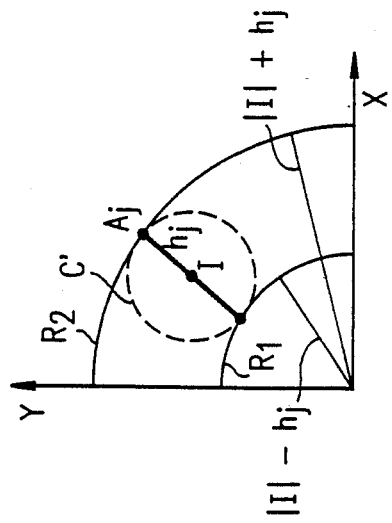
FIG. 5 is a graphic representation of an input vector and a codebook vector in a vector space and two arcs which define a range of norms around the input vector.
Figure 4:
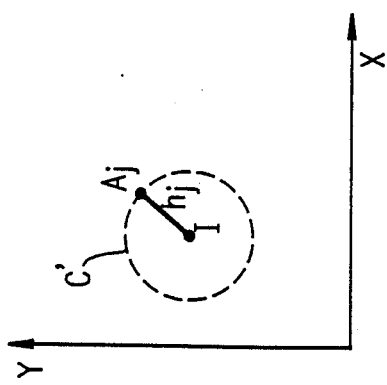
FIG. 4 is a graphic representation of an input vector and a representative codebook vector in a vector space and a circle which deliniates a region around the input vector.
Figure 3:
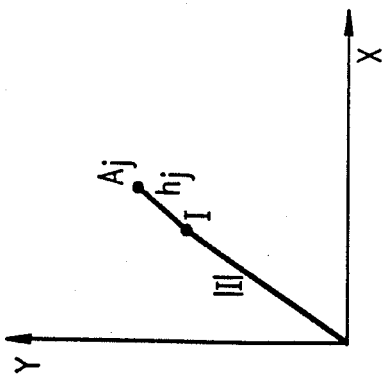
FIG. 3 is a graphic representation of an input vector and a representative codebook vector in a vector space and the distance between them.

Step 4, identifying the subset S of those codebook vectors having a norm in the range $|I|-h_{I,j}$ to $|I|+h_{I,j}$ reduces the number of vectors which must be evaluated in the search to those which might be closer than $A_j$. This range of norms can be visualized as selecting all vectors in a band of distances from the origin. FIG. 3 shows a two-dimensional vector space, an input vector I, and a reference codebook vector $A_j$. FIG. 4 shows the vectors of FIG. 3, and additionally shows a circle C of radius $h_{Ij}$ about the input vector I. A better match to I than $A_j$ must lie within the circle C. FIG. 5 shows two arcs $R_1$, $R_2$ which lie at distance $|I|-h_{I,j}$ and $|I|+h_{I,j}$ respectively. The circle C lies between the arcs $R_1$, $R_2$ therefore, the best match also lies between the arcs $R_1$, $R_2$. Step 4 limits the set S to codebook vectors which lie between the arcs $R_1$ and $R_2$. Such a range of norms is convenient, because a table of norms was already computed for use in Step 2 and look-up procedures are fast.

From the example, $|I|=4.5$ and $h_{I,j}=2.5$. $|I|-h_{I,j}$ equals 2.0. $|I|+h_{I,j}$ equals 7.0. Therefore, only those vectors whose norms are in the range 2.0 to 7.0 are selected. From Table I, those vectors can be found by inspection to be $A_9$, $A_{13}$, and $A_{14}$, (their entries in Table I are underscored for emphasis.)

Each step of the process to this point utilize different methods to determine different relationships among different vector quantities. Step 1 computed the norm of the input vector I. Step 2 utilized a table to determine the codebook vectors $A_j$ having a norm closest to the norm of I. Step 3 computed the distance $h_{Ij}$ between the input vector I and the reference vector $A_j$ (which was found in the example to be $A_{13}$). Step 4 combined the norm of I with the distance $h_{Ij}$ to establish a range of norms.

The fifth step of the search process is to select one vector from the subset S which best matches the input vector. One method for accomplishing this step is to compute the distance between the input vector and each vector in the subset S, and to then select the vector with the minimum distance.

As an alternative to an exhaustive search in step 5, the preferred embodiment instead performs a selective search of the subset S. First, the distance $h_{I,k}$ between the input vector I and any one of the vectors $A_k$ from the subset S is computed. If the distance $h_{I,k}$ is greater than the previously computed distance $h_{I,j}$, the vector $A_k$ is eliminated from the subset S. If, however, the distance $h_{I,k}$ is less than $h_{I,j}$, then the reference vector $A_j$ is eliminated from the set. Further, $A_k$ becomes the new reference vector, and a new subset S' is formed. Vectors of the new subset S' are those vectors from the old subset S whose norms fall within the range $|I| - h_{I,k}$ to $|I| + h_{I,k}$. This method reduces even further the number of codebook vectors for which distance must be computed.

In the example discussed above, the subset S contained three vectors $A_9$, $A_{13}$, and $A_{14}$. The distance $h_{I,j}$ was previously computed as 2.5. According to the method just described, any vector, e.g., $A_9$ may be selected, and the distance $h_{I,9}$ to the input vector I is calculated. The coordinates of $A_9$ are, from FIG. 2, {2,4}. The coordinates of I are {1,3.5}. The distance $h_{I,9}$ is 1.5:

$$|(1-2)| + |(3.5-4)| = 1.5$$

This distance $h_{I,9}$ is smaller than the previously computed distance $h_{I,13}$, therefore the old vector $A_{13}$ is eliminated from the set S. Further, $A_9$ becomes the new reference vector, and a new subset S' is formed. Vectors of the new subset S' are those vectors from the old subset S whose norms are now in the range 3.0 to 6.0:

| $|I| - h_{I,k}$ | to | $|I| + h_{I,k}$ |
|---|---|---|
| 4.5 − 1.5 | to | 4.5 + 1.5 |
| 3.0 | to | 6.0 |

From table I, the norm of codebook vector $A_{14}$ is 6, therefore, $A_{14}$ remains in the new subset S'.

The coordinates of $A_{14}$ are found from FIG. 2 to be {4,2}. The distance $h_{I,14}$ from $A_{14}$ to I is now found to be 4.5:

$$|(1-4)| + |(3.5-2)| = 4.5$$

The distance $h_{I,14}$ is greater than the distance $h_{I,9}$ (from I to $A_9$). $A_{14}$ is therefore eliminated from the new subset S'. $A_9$ is the last remaining codebook vector in the subset S', therefore, $A_9$ is selected as the best match.

In the application to vector quantizers, the distance between vectors is a measure of distortion. For the purpose of different applications (such as voice, image or other sources of data), other norms (i.e., other measures of distortion) can be defined. These norms can still be used, and benefit from the present invention, because any reduction in the number of distance computations improves speed. Depending on the norm used, ranges of optimum size can be drawn around the input vector and still include the best match. Even if the selected norm does not always select the optimal match, a close match may have so low a distortion that it is still suitable for the ultimate application.

SECOND EMBODIMENT

The second embodiment is identical to the first embodiment, except that a different method is used to select the sets S and S' in the fourth and fifth step.

In the second embodiment, the fourth step identifies a subset S of codebook vectors whose distance from the reference codebook vector $A_j$ is less than twice the distance $h_{Ij}$ between the input vector I and the reference codebook vector $A_j$. Such a limit ensures that the best match to the input vector will be part of the subset S as long as the norm satisfies the following relationship (known as the triangle inequality):

$$d(A_i,A_j) \leq d(A_j,I) + d(I,A_i)$$

where I is an input vector (which may be any vector in the vector space) and $A_i$ and $A_j$ are any codebook vectors (which may also be any vectors in the vector space).

Figure 8:
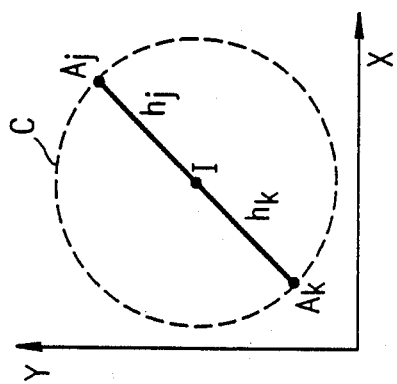
FIG. 8 is a graphic representation of an input vector and a codebook vector in a vector space and a second codebook vector within a circular region around the input vector.
Figure 7:
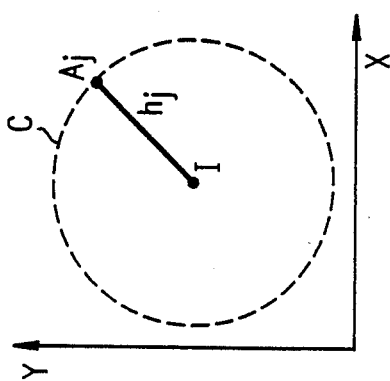
FIG. 7 is a graphic representation of an input vector and a codebook vector in a vector space and a circular region around the input vector.
Figure 6:
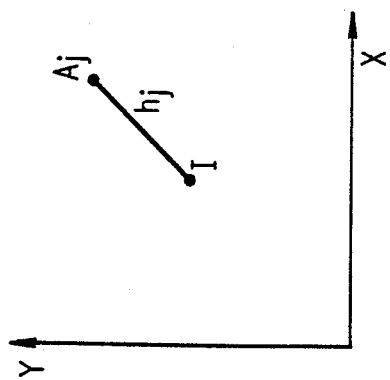
FIG. 6 is a graphic representation of an input vector and a codebook vector in a vector space and the distance between them.

FIGS. 6–8 illustrate the triangle inequality for the special case of two-dimensional vectors. FIG. 6 shows a two-dimensional axis X,Y which represents part of a two-dimensional vector space. Vectors are shown as points I and $A_j$. The point I represents an input vector to be quantized and $A_j$ represents a codebook vector selected in step 2 as having a norm most nearly equal to the input vector I. The distance between I and $A_j$ is shown graphically as a line segment $h_{I,j}$ connecting the points I and $A_j$.

FIG. 7 shows the vectors of FIG. 6 and additionally shows a circle C' of radius $h_{I,j}$ drawn around the input vector I. If another codebook vector exists which is closer to the input I than the initially selected codebook vector $A_j$, then the vector must lie within the circle C'. FIG. 8 shows such a vector $A_k$ lying an infinitesimal distance within the circle C' but on the opposite side of the circle C' from $A_j$. Such a position is the farthest distance such a new vector $A_k$ can be from the initially selected vector $A_j$, yet still be as close or closer to the input vector I. The distance between $A_k$ and $A_j$ is infinitesimally smaller than the diameter of the circle C. The diameter of the circle C' is twice the distance $h_j$ between $A_j$ and I. For all other vectors $A_i$ within the circle, the distance between those vectors $A_i$ and the initially selected vector $A_j$ is less than twice the distance between the input vector I and the initially selected vector $A_j$. This is the condition of the triangle inequality. While the triangle inequality has been proved here for two-dimensional vectors, it can be shown to hold for vectors of an arbitrary dimension.

The second embodiment utilizes a memory matrix to quickly identify the elements of the set S. Table II shows the algebraic format of the matrix entries.

TABLE II

| O | $d(A_1,A_2)$ | $d(A_1,A_3)$ | — | $d(A_1,A_m)$ |
|---|---|---|---|---|
| $d(A_2,A_1)$ | O | $d(A_2,A_3)$ | — | $d(A_2,A_m)$ |
| $d(A_3,A_1)$ | $d(A_3,A_2)$ | O | — | $d(A_3,A_m)$ |
| $d(A_m,A_1)$ | $d(A_m,A_2)$ | $d(A_m,A_3)$ | — | O |

The first row of the matrix, for example, contains distances between the first codebook vector and each other codebook vector. The entries on the matrix diagonal are all zero, since the distance between a vector and itself is zero. The first entry of the first row is thus zero.

The second entry of the first row is $d(A_1,A_2)$ which is the distance between codebook vector $A_1$ and codebook Vector $A_2$. The third entry of the first row is $d(A_1,A_3)$ which is the distance between codebook vector $A_1$ and codebook vector $A_3$. The last entry is $d(A_1, A_m)$ where m is the number of vectors in the codebook. For this example, m=sixteen. The second row contains distances between codebook vector $A_2$ and the other codebook vectors. Other rows contain distance values for other vectors. The matrix is square. It is also symmetric about the main diagonal, because the distance $A_j$ and $A_k$ is the same as the distance between $A_k$ and $A_j$.

Table III shows numeric entries of the distance matrix for the sample vectors shown in FIG. 2.

TABLE III

|  | $A_1$ | $A_2$ | $A_3$ | $A_4$ | $A_5$ | $A_6$ | $A_7$ | $A_8$ | $A_9$ | $A_{10}$ | $A_{11}$ | $A_{12}$ | $A_{13}$ | $A_{14}$ | $A_{15}$ | $A_{16}$ |
|---|---|---|---|---|---|---|---|---|---|---|---|---|---|---|---|---|
| $A_1$ | 0 | 2 | 4 | 6 | 2 | 4 | 6 | 8 | 4 | 6 | 8 | 10 | 6 | 8 | 10 | 12 |
| $A_2$ | 2 | 0 | 2 | 4 | 4 | 2 | 4 | 6 | 6 | 4 | 6 | 8 | 8 | 6 | 8 | 10 |
| $A_3$ | 4 | 2 | 0 | 2 | 6 | 4 | 2 | 4 | 8 | 6 | 4 | 6 | 10 | 8 | 6 | 8 |
| $A_4$ | 6 | 4 | 2 | 0 | 8 | 6 | 4 | 2 | 10 | 8 | 6 | 4 | 12 | 10 | 8 | 6 |
| $A_5$ | 2 | 4 | 6 | 8 | 0 | 2 | 4 | 6 | 2 | 4 | 6 | 8 | 2 | 4 | 6 | 10 |
| $A_6$ | 4 | 2 | 4 | 6 | 2 | 0 | 2 | 4 | 4 | 2 | 4 | 6 | 6 | 4 | 8 | 6 |
| $A_7$ | 6 | 4 | 2 | 4 | 4 | 2 | 0 | 2 | 6 | 4 | 2 | 4 | 8 | 6 | 4 | 6 |
| $A_8$ | 8 | 6 | 4 | 2 | 6 | 4 | 2 | 0 | 8 | 6 | 4 | 2 | 10 | 8 | 6 | 4 |
| $A_9$ | 4 | 6 | 8 | 10 | 2 | 4 | 6 | 8 | 0 | 2 | 4 | 6 | 2 | 4* | 6* | 8 |
| $A_{10}$ | 6 | 4 | 6 | 8 | 4 | 2 | 4 | 6 | 2 | 0 | 2 | 4 | 4 | 2 | 4 | 6 |
| $A_{11}$ | 8 | 6 | 4 | 6 | 6 | 4 | 2 | 4 | 4 | 2 | 0 | 2 | 6 | 4 | 2 | 4 |
| $A_{12}$ | 10 | 8 | 6 | 4 | 8 | 6 | 4 | 2 | 6 | 4 | 2 | 0 | 8 | 6 | 4 | 2 |
| $A_{13}$ | 6 | 8 | 10 | 12 | 4 | 6 | 8 | 10 | 2 | 4 | 6 | 8 | 0 | 2 | 4 | 6 |
| $A_{14}$ | 8 | 6 | 8 | 10 | 6 | 4 | 6 | 8 | 4 | 2 | 4 | 6 | 2 | 0 | 2 | 4 |
| $A_{15}$ | 10 | 8 | 6 | 8 | 8 | 6 | 4 | 6 | 6 | 4 | 2 | 4 | 4 | 2 | 0 | 2 |
| $A_{16}$ | 12 | 10 | 8 | 6 | 10 | 8 | 6 | 4 | 8 | 6 | 4 | 2 | 6 | 4 | 2 | 0 |

The first entry of the thirteenth row (highlighted for emphasis) shows that the distance between $A_{13}$ and $A_1$ is six. The second entry of the thirteenth row (highlighted for emphasis) shows that the distance between $A_{13}$ and $A_2$ is eight. By reading across the thirteenth row, one can quickly identify the vectors having a distance to $A_{13}$ which is less than twice $h_{I,j}$. Because twice $h_{I,j}$ equals five ($2h_{I,j}=5$), only those vectors whose entry in the thirteenth row is five or less is selected for inclusion in the set S. Those vectors are $A_5$, $A_9$, $A_{10}$, $A_{14}$, and $A_{15}$ and their entries are highlighted for emphasis. In this way, step 4 eliminates from consideration those vectors which are so far away from $A_j$ that they must be far away from the input vector I.

The fifth step identifies one vector from the set S which is the best match to the input vector I. First, the distance $h_{I,k}$ between the input vector I and any one of the vectors $A_k$ from the subset S is computed. If the distance $h_{I,k}$ is greater than the previously computed distance $h_{I,j}$, the vector $A_k$ is eliminated from the subset S. If, however, the distance $h_{I,k}$ is less than $h_{I,j}$, then the reference vector $A_j$ is eliminated from the set. Further, $A_k$ becomes the new reference vector, and a new subset S' is formed. Vectors of the new subset S' are those vectors from the old subset S whose distance from the new reference codebook vector $A_k$ is less than twice $h_{I,k}$.

In the example discussed above, the subset S contained six vectors: $A_5$, $A_9$, $A_{10}$, $A_{13}$, $A_{14}$, and $A_{15}$. The previously identified reference codebook vector $A_{13}$ had a distance $h_{I,j}$ to I which was previously computed as 2.5. One vector may be chosen arbitrarily, such as $A_5$, and the distance $h_{I,5}$ between $A_5$ and the input vector I is computed. As can be seen from FIG. 2, the coordinates of $A_5$ are {2,6}. The coordinates of I are {1,3.5}. The distance $h_{I,t}$ is 3.5: $|2-1+6-3.5|=3.5$. The distance $h_{I,5}$ is greater than the distance $h_{I,13}$, therefore, the vector $A_5$ is eliminated from the set S.

Taking another vector, $A_9$ from the set S, the process is repeated. The coordinates of $A_9$ are found from FIG. 2 to be {2,4}. The distance $h_{I,9}$ from $A_9$ to the input vector I is 1.5: $|2-1|+|4-3.5|=1.5$. The distance $h_{I,9}$ is smaller than the distance $h_{I,13}$, therefore the old reference codebook vector $A_{13}$ is eliminated from the set S. Further, $A_9$ becomes the new reference codebook vector, and a new subset S' is formed. Vectors of the sew subset S' are those vectors of the subset S whose distance to the new reference codebook vector $A_9$ is less than twice $h_{I,9}$. Twice $h_{I,9}$ is three. By looking across the ninth row of the matrix of table III, the distances from $A_9$ to $A_{14}$ and $A_{15}$ are found to be four and six respectively (and their entries are marked with astrisks for emphasis). These vectors are excluded from the subset S'. The distances from $A_9$ to $A_{10}$ is two (and its entry is marked in bold for emphasis). The new subset S' thus contains only the vectors $A_9$ and $A_{10}$.

The coordinates of $A_{10}$ are {4,4}. The distance $h_{I,10}$ from $A_{10}$ to the input vector I (whose coordinates are {1,3.5}) is 4.5: $|4-1|+|4-3.5|=4.5$. The distance $h_{I,10}$ is greater than the distance $h_{I,9}$ (the distance from the input vector to the new reference codebook vector $A_9$), therefore, $A_{10}$ is eliminated from the subset S'. The only vector remaining in the subset S' is $A_9$, and $A_9$ is selected as the best match.

THIRD EMBODIMENT

The third embodiment combines aspects of both the first and second embodiment. In Step 4, the set S includes codebook vectors which satisfy two conditions:
(1) the norm of the vector must be in the range $|I|-h_{I,j}$ to $|I|+h_{I,j}$, and
(2) the distance of the vector must be less than twice the distance between the input vector and the reference codebook vector.

In essence, this includes only those codebook vectors which would have been chosen by both the preferred embodiment and the second embodiment.

In Step 5, the set S' contains only those codebook vectors from the previous set S which satisfy the same two conditions above for the new reference codebook vector.

SYSTEM DESCRIPTION

Figure 9:
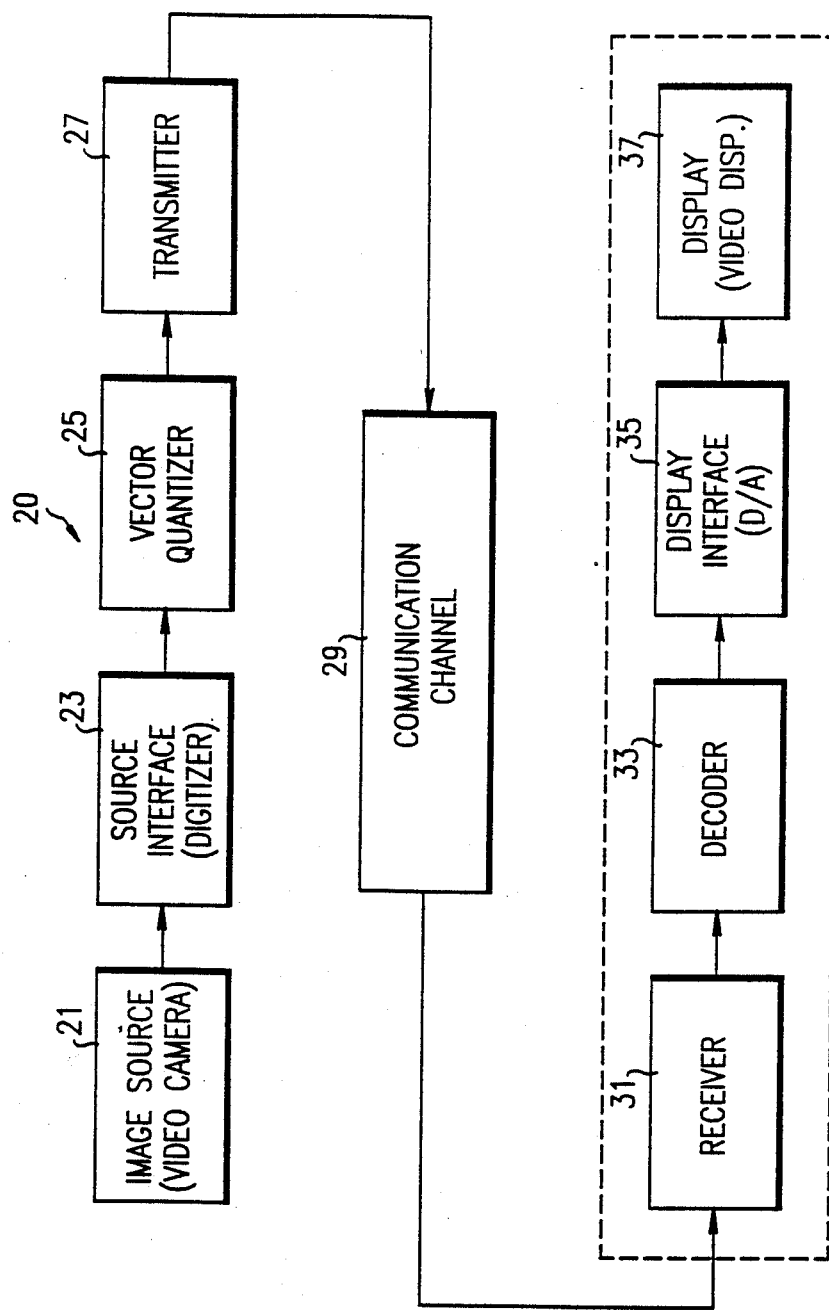
FIG. 9 is a block diagram of a system for transmitting data including a vector quantizer incorporating the present invention.

FIG. 9 is a block diagram of a system 20 including a vector quantizer 25 in accordance with the present invention for transmitting image data. The system also includes an image source 21, a source interface 23, a transmitter 27, a communication channel 29, a receiver 31, a decoder 33, a display interface 35, and a display 37.

Image data originates from a source 21 which may be, for example, a color video camera. The source generates an analog video signal which consists of the Y, I and Q components of the raster pattern formed when the source 21 scans a scene. Y,I, and Q components are linear combinations of the red, blue, and green components of the color signal. Y is chosen so that it, alone, is equivalent to a black-and-white picture signal. The I and Q channels are mutually orthogonal to each other and to the Y signal, and they provide color information. The raster scan repeats according to the well known interlace pattern. The source interface 23 samples the analog video signal and generates a digital signal which is also organized as a series of frames. Each frame consists of a series of digital pixel values for one complete raster scan.

The vector quantizer 25 contains stored codebook vectors selected during the design of the quantizer. Linde, Buzo and Grey describe one method for designing the codebook set in their article entitled "*An Algorithm for Vector Quantizer Design*", IEEE Transactions on Communications, Vol. Com-28, No. 1 (Jan. 1980).

The vector quantizer 25 receives the series of pixel values from the source interface 23, organizes them into image vectors, selects the codebook vector which is the best match for each image vector, and then generates an output signal consisting of a series of identification codes for the selected codebook vectors. In practice, the identification code for a codebook vector may be an address in a memory which stores the vector values. The precise order of the entries may be arbitrary, or it may be selected according to some property of the vectors.

The transmitter 27 converts the identification codes into a form which is compatible with a communication channel 29. The signal from the vector quantizer is a digital voltage signal. The communication channel 29 may be a public switched telephone network. The transmitter 27 may be a modem for taking digital data and modulating it onto a carrier. For the purpose of a laboratory test device, the transmitter may alternatively be simply a standard RS-232 computer interface. The communication channel 29 would then be simply an RS-232 cable.

FIG. 9 also shows a portion of the system 30 which receives the quantized signal from the communication channel 29 and regenerates the image. A receiver 31 receives the quantized signal via a communication channel 29 and converts the signal to a digital format compatible with the decoder 33. For the purpose of a laboratory test device, the receiver may be simply a standard RS-232 computer interface.

The decoder 33 replaces the identification codes with the pixel values of the associated codebook vectors. It has stored a set of codebook vectors which are identical to the set used to quantize the original image vectors. The decoder 33 generates an output which is a series of pixel values in raster scan sequence.

The decoder 33 transfers digital pixel values to a display interface 35. The display interface 35 converts the digital signal to an analog signal in a form compatible with the final display device 37. It, in essence, performs the digital to analog conversion and regenerates a video signal.

Figure 10:
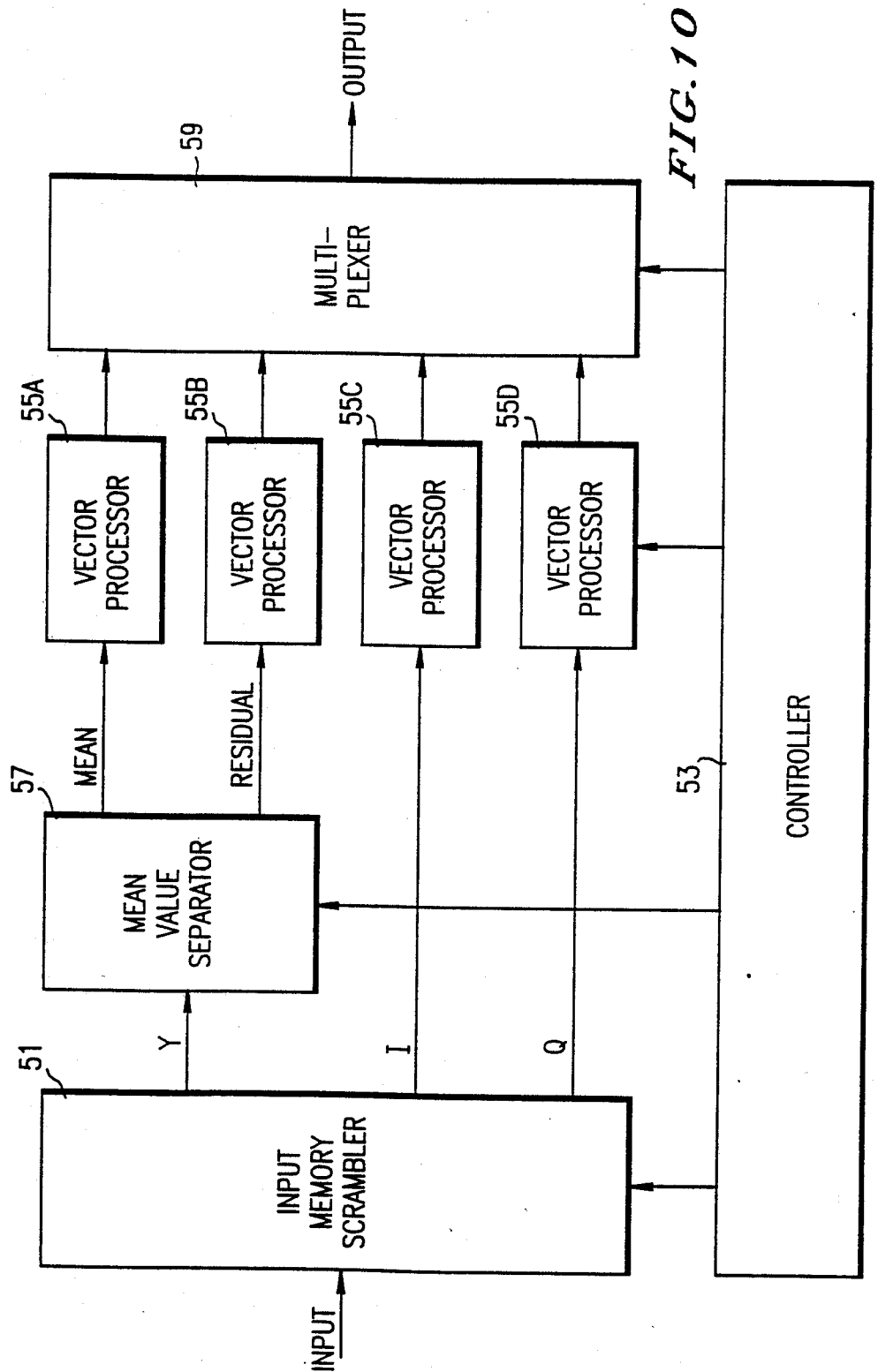
FIG. 10 is a block diagram of a vector quantizer incorporating the present invention.

FIG. 10 shows a block diagram of the vector quantizer. It consists of an input memory scrambler 51, a controller 53, vector processors 55A–55D, a mean value separator 57, and a multiplexer 59.

The input memory scrambler 51 receives one frame of digitized Y, I and Q pixel values from the source interface 23 (FIG. 9). Pixel values are written into the memory 51 in the order received, which is the raster scan order. Pixel values are read out of the memory in vector form, where vectors consist of 6×6 pixel block, (that is to say, six adjacent pixels from each of six adjacent lines).

The controller 53 directs the input memory scrambler 51 to transfer "I" and "Q" vectors to separate vector processors 55C, 55D. The controller also directs the input memory scrambler 51 to transfer the "Y" vector to a mean value separator 57.

The mean value separator 57 normalizes the vector by computing the mean value of the 36 vector elements and subtracting the mean value from each element. The controller 53 directs the mean value separator 57 to transfer the mean value to a vector processor 55A. (The mean value is a vector in which each of the 36 element is the mean value of the original 36 elements.) For example, if a vector consists of 36 pixel values $\{p_1, p_2, \ldots p_{36}\}$, the mean value separator computes the average value of the 36 pixels ($p_{ave} = 1/36 \, \Sigma p_i$). The mean value separator 57 generates a residual vector by subtracting the mean value $P_{ave}$ from each pixel element. The controller 53 also directs the mean value separator 57 to transfer the residual vector to another vector processor 55A. The residual vector is the remainder left after the mean value separator 57 subtracts the mean value from the "Y" vector.

Vector processors 55A–55D replace vectors with identification codes of codebook entries. The vector processors 55A–55D are microprocessors with memory, and other standard devices operating under software control to perform the search technique that was discussed in detail above. The controller 53 then directs the vector processors 55A–55D to transfer the ID codes to a multiplexer 59 which multiplexes the four ID codes into a serial signal. The serial signal passes to the transmitter 27 (FIG. 9).

Figure 11:
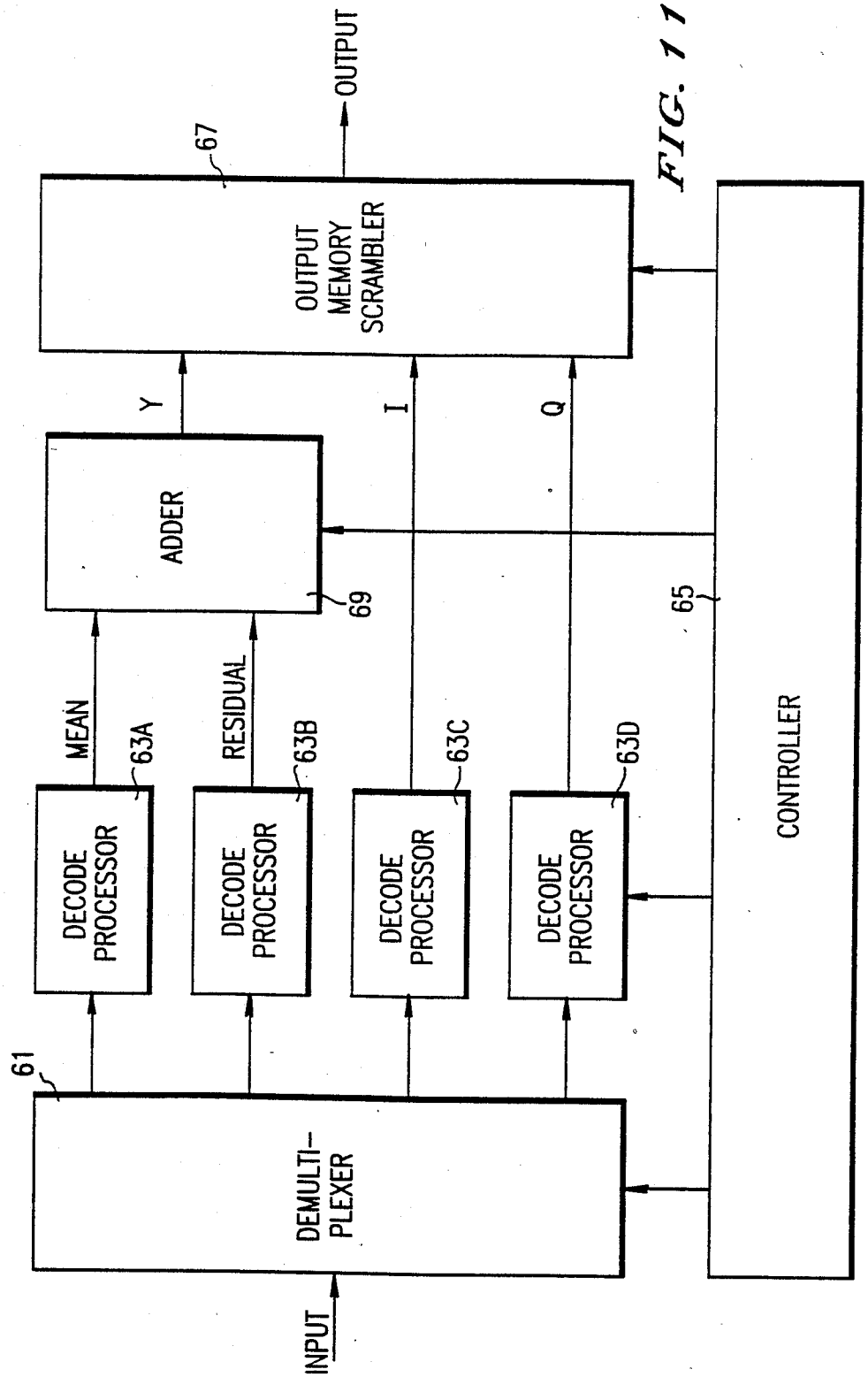
FIG. 11 is a block diagram of a decoder for regenerating data from quantized signals.

FIG. 11 shows a block diagram of the decoder 33. A demultiplexer 61 receives the quantized signal, which is a multiplexed series of identification codes. The demultiplexer 61 separates the multiplexed identification codes into four separate series of identification codes, one series for each of the I, Q, residual Y, and mean value Y signals. A controller 65 directs the demultiplexer 61 to transfer each of the four signal streams to a decode processor 63A–63D. Each decode processor 63A–63D has stored in it a full set of codebook vectors. Each decode processor 63A–63D replaces the identification code with the thirty six individual pixel values. The controller 65 directs the decode processor 63B for the residual Y signal and the decode processor 63A for the mean value Y signals to transfer their pixel values to an adder 69 which adds the mean value to each normalized Y pixel value. The adder 69 thus restores the Y signal. The controller 65 directs the other decode processors 63C, 63D and the adder 69 to transfer the restored Y, I, and Q signal to an output memory scrambler 67. Y, I, and Q signals are written into the output memory scrambler 67 in vector form. That is to say that each vector contains six pixels from six adjacent scan lines. The controller 65 directs the output memory scrambler 67 to generate an output which is a series of the pixel values in raster scan order.

STORAGE SYSTEM VARIATION

Figure 12:
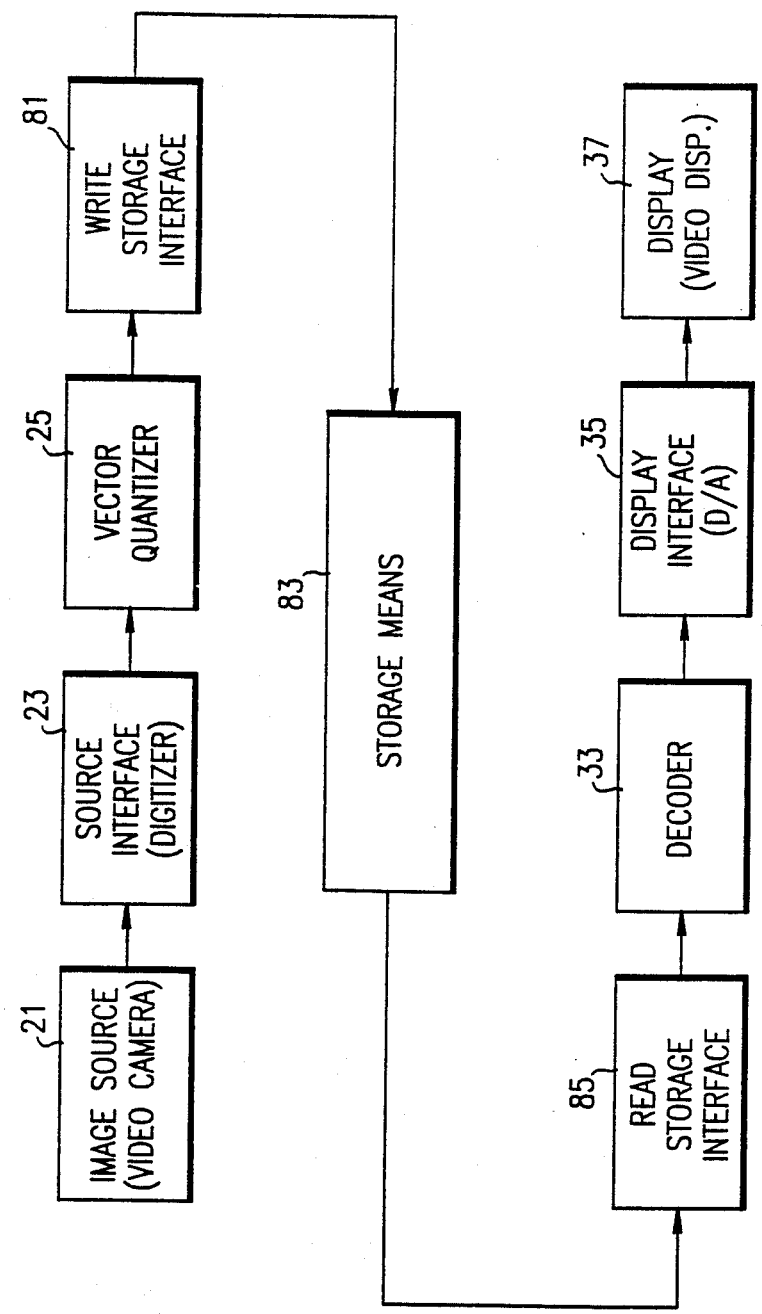
FIG. 12 is a block diagram of a system for storing data including a vector quantizer incorporating the present invention.

FIG. 12 shows a first variation on a system incorporating the present invention for storing quantized images, rather than for transmitting them. Many functional elements are identical to those in the system shown in FIG. 9, and identical elements are denoted with the same reference numbers and are not further discussed. The system of FIG. 12 includes a write storage interface 81, a storage means 83, and a read storage interface 85. The storage means 83 may be any of many well known storage media for electronic signals. It may, for example, be magnetic tape, hard disk memory, optical memory, or solid state memory. The write storage interface 81 and read storage interface 85 may be any well known device for reading and writing respectively to the chosen medium.

QUANTIZER TEST BED

Figure 13:
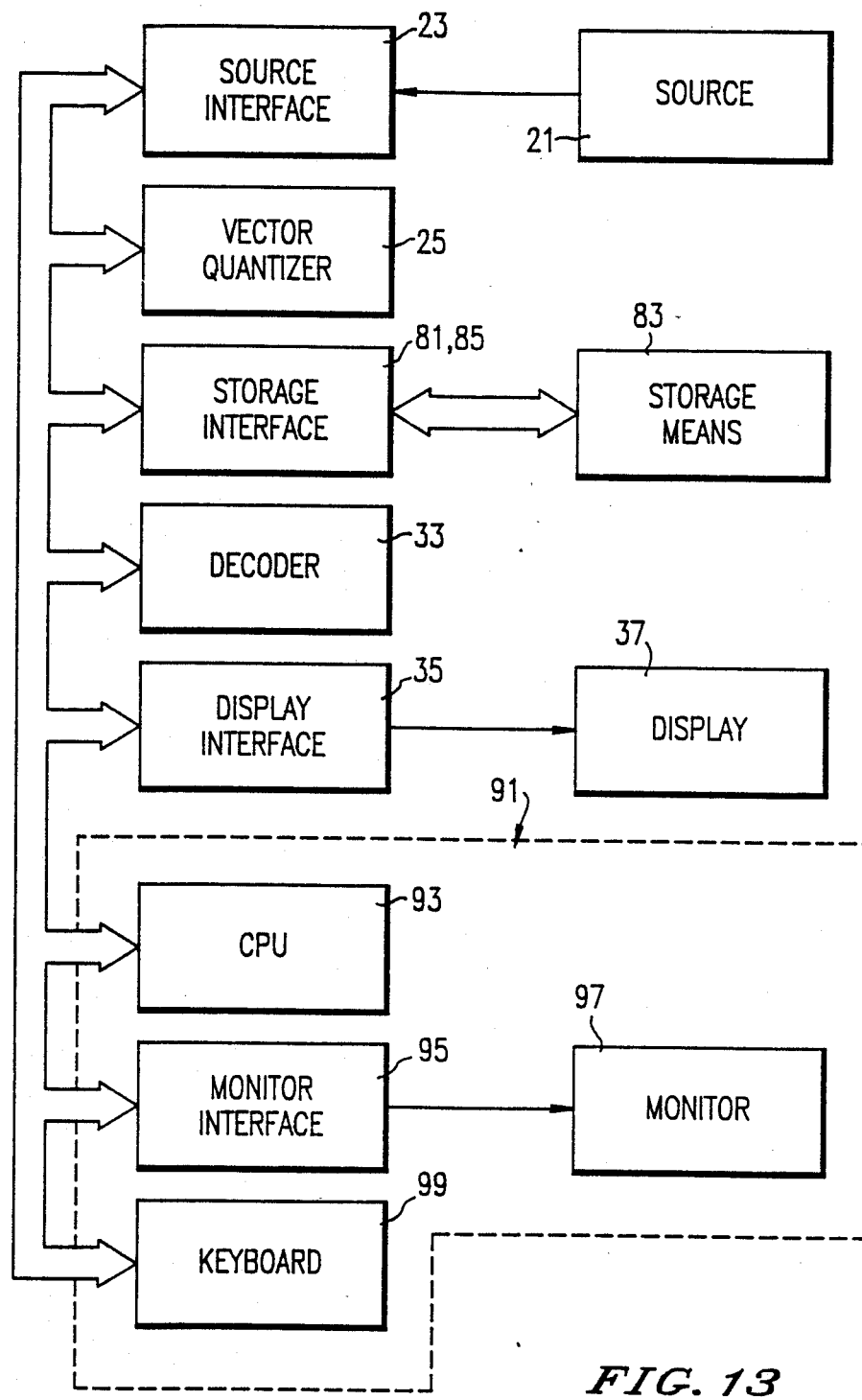
FIG. 13 is an alternative architecture of a system for storing data including a vector quantizer incorporating the present invention.

FIG. 13 shows a block diagram of an embodiment used to develop and test functional elements of the systems shown in FIGS. 9 and 12. Items of FIG. 13 which are identical to corresponding items found in FIGS. 9 and 12 are shown with identical reference numbers and are not further discussed. The test bed architecture differs from the FIG. 9 architecture in that a host computer 91 provides a data bus 92 as a communications path common to many of the functional elements. Communications in the architecture of FIG. 9 uses discrete connections between functional elements. An "IBM AT compatible" computer may serve as a host computer 91. Circuitry unique to the vector quantizer may be in the form of "expansion cards" for the computer bus. The host computer 91 utilizes commercial software to control its operation. A human operator may start, stop, and monitor the quantization function. These operations are unique to testing and debugging the quantizer. They are not critical to the invention and are not described in detail here.

The invention may have many applications in addition to quantization of image vectors. In the field of artificial intelligence, for example, it is often desirable to recognize a pattern. The pattern may be a voice command, the image of an object, or the electromagnetic "signature" of an enemy aircraft. In general, some data element (e.g. image vector) is compared to a set of representative elements (e.g. codebook vectors) for the purpose of identifying a representative element which matches the input. (The match may be precise or approximate).

While the invention has been described in connection with specific embodiments thereof, it will be understood that it is capable of further modifications. This application is intended to cover any variations, uses or adaptations of the invention following, in general, the principles of the invention, and including such departures from the present disclosure as come within known and customary practice within the art to which the invention pertains.

What is claimed is:

1. A method for searching a set of representative elements to locate one element which closely matches an input element, the method comprising:
    (a) calculating the value of a characteristic measure for the input element,
    (b) identifying a reference element, $A_j$, having a value of the characteristic measure which satisfies a first criterion,
    (c) computing a distance, $h_{I,j}$, between the input element and the reference element $A_j$,
    (d) identifying a subject, S, of representative elements for which a measure of the representative elements in the subset S satisfies a second criterion with respect to the reference element,
    (e) selecting a representative element from the subset S which closely matches the input element.

2. A method for compressing data comprising the steps of:
    (a) generating a set of codebook vectors, each codebook vector identified by a unique identification code,
    (b) organizing the data as a set of input vectors,
    (c) for each input vector:
        (i) calculating the value of a characteristic measure for the input vector,
        (ii) identifying a reference codebook vector, $A_j$, having a value of a measure which satisfies a first criterion,
        (iii) computing a distance, $h_{I,j}$, between the input vector. and the reference codebook vector $A_j$,
        (iv) identifying a subset, S, of codebook vectors for which a measure of codebook vectors of the subset S satisfies a second criterion with respect to the reference vector,
        (v) selecting a codebook vector from the subset S which closely matches the input vector,
    (d) expressing each input vector as the identification code of the selected, closely matching codebook vector.

3. A method in accordance with claim 2 wherein the characteristic measure for the input vector comprises a vector norm.

4. A method in accordance with claim 2 wherein identifying a reference codebook vector, $A_j$, comprises the step of: identifying a reference codebook vector, $A_j$, having a norm which most nearly equals the norm of the input vector.

5. A method in accordance with claim 2 wherein the step of calculating the characteristic measure of an input vector executes fewer computational steps than calculating the distance between an input vector and another vector.

6. A method in accordance with claim 2 wherein identifying a reference codebook vector, $A_j$, comprises the step of: comparing the value of the characteristic measure of the input vector to calculated and stored values of the characteristic measures of the codebook vectors.

7. A method in accordance with claim 2 wherein the codebook vectors of the subset S have norms in the range $|I| - h_{I,j}$ to $|I| + h_{I,j}$ where $|I|$ is the norm of the input vector and $h_{I,j}$ is the distance between the reference codebook vector $A_j$ and the input vector I.

8. A method in accordance with claim 2 wherein the distance between the reference codebook vector $A_j$ and codebook vectors of the subset S is less than twice the distance $h_{I,j}$ between the reference codebook vector $A_j$ and the input vector.

9. A method in accordance with claim 2 wherein
    (a) the codebook vectors of the subset S have norms in the range $|I| - h_{I,j}$ to $|I| + h_{I,j}$ where $|I|$ is the norm of the input vector and $h_{I,j}$ is the distance between the reference codebook vector $A_j$ and the input vector I, and (b) the distance between the reference codebook vector $A_j$ and codebook vectors of the subset S is less than twice the distance $h_{I,J}$ between the reference codebook vector $A_j$ and the input vector.

10. A method in accordance with claim 2 wherein the distance measure satisfies the following condition:

$$d(x,A_i) \leq d(x,A_j) + d(A_j,A_i) \qquad (10)$$

where $d(x,A_i)$ is the distance measure, and $X_i$ is an input vector, and $A_j$ and $A_i$ are codebook vectors.

11. A method in accordance with claim 2 further comprising the step of: (a) calculating the distances among codebook vectors in advance of expressing the data as a set of input vectors, and (b) comparing the distances among codebook vectors calculated in advance with the condition of the second criterion.

12. A method in accordance with claim 2 wherein selecting a codebook vector from the subset S comprises the step of: selecting the codebook vector from the subset S which has the minimum distance to the input vector.

13. A method in accordance with claim 2 wherein selecting a codebook vector from the subset S comprises the steps of:
(a) computing a distance $h_{I,k}$ between the input vector and a codebook vector $A_k$ of the subset S,
(b) eliminating the element $A_k$ from the set S if the distance $h_{I,k}$ between the input vector and the codebook vector is greater than or equal to the distance $h_{I,j}$ between the input vector and the reference codebook vector,
(c) forming a new subset S' by eliminating the element $A_j$ from the subset S and designating $A_k$ to be the new reference vector if the distance $h_{I,k}$ between the input vector and the codebook vector is less than the distance $h_{I,j}$ between the input vector and the reference codebook vector, and
(d) repeating steps (a) through (c) until all but one codebook vector has been eliminated.

14. A method in accordance with claim 13 wherein forming a new set S' further comprises the step of: eliminating from the subset S those codebook vectors whose norm is outside the range $|I|-h_{I,j}$ to $|I|+h_{I,j}$ where $h_{I,j}$ is the distance between the reference codebook vector $A_j$ and the input vector I.

15. A method in accordance with claim 13 wherein forming a new set S' further comprises the step of: eliminating from the subset S those codebook vectors whose distance to the new reference vector $A_k$ is greater than or equal to twice the distance $h_{I,k}$ between the input vector and the new reference vector.

16. A method in accordance with claim 13 wherein forming a new set S' further comprises the step of: retaining in the subset S those codebook vectors for which:
(a) the norm is in the range $|I|-h_{I,j}$ to $|I|+h_{I,j}$ where $h_{I,j}$ is the distance between the reference codebook vector $A_j$ and the input vector I, and
(b) the distance to the new reference vector $A_k$ is greater than or equal to twice the distance $h_{I,k}$ between the input vector and the new reference vector.

17. An apparatus for compressing data in the form of an input vector into an identification code of one of a set of codebook vectors, said apparatus comprising:

(a) input means for receiving the input vector and codebook vectors,
(b) memory means connected to the input means for storing the input vector and codebook vectors,
(d) vector processor means connected to the memory means, said processor means comprising:
   (i) measuring means responsive to the input vector for calculating the value of a characteristic measure for the input vector;
   (ii) identification means responsive to the calculated characteristic measure for the input vector and to codebook vectors for identifying a reference codebook vector, $A_j$, having a value of the characteristic measure which satisfies a first criterion;
   (iii) computing means responsive to the identified reference codebook vector, $A_j$, and to the input vector for computing a distance, $h_{I,j}$, between the input vector and the reference codebook vector $A_j$;
   (iv) partitioning means responsive to the computed distance $h_{I,j}$ and to codebook vectors having identifying a subset, S, of codebook vectors having measures which satisfy a second criterion with repsect to the input vector,
   (v) comparing means responsive to the subset S of codebook vectors and to the input vector for selecting a codebook vector from the subset S, which closely matches the input vector,
(e) output means connected to the processor means for generating an output signal, said signal output representative of the identification code of the closely matching codebook vector.

18. An apparatus in accordance with claim 17 wherein said memory means further comprises characteristic measure memory means for storing values of the characteristic measures of codebook vectors.

19. An apparatus in accordance with claim 17 wherein said memory means further comprises distance matrix memory means for storing values of the distances between codebook vectors.

20. A system for compressing and regenerating input vector data using codebook vectors, said system comprising:
(a) a source of input vector data;
(c) a vector quantizer connected to said source for quantizing said data, said vector quantizer comprising:
   (i) input means for receiving an input vector,
   (11) memory means connected to the input means for storing said input vector and codebook vectors,
   (iii) vector processor means connected to the memory means, said processor means comprising:
      (A) measuring means responsive to the input vector for calculating the value of a characteristic measure for the input vector;
      (B) identification means responsive to the calculated characteristic measure for the input vector and to codebook vectors for identifying a reference codebook vector, $A_j$, having a value of the characteristic measure which satisfies a first criterion;
      (C) computing means responsive to the identified reference codebook vector, $A_j$, and to the input vector for computing a distance, $h_{I,j}$, between the input vector and the reference codebook vector $A_j$;

(D) partitioning means responsive to the computed distance $h_{i,j}$ and to codebook vectors for identifying a subset, S, of codebook vectors having measures which satisfy a second criterion with respect to the reference vector, (E) comparing means responsive to the subset S of codebook vectors and to the input vector for selecting a codebook vector from the subset S, which closely matches the input vector;

(iv) output means connected to the processor means for generating a compressed signal, said compressed signal representative of the identification code of the closely matching codebook vector;

(e) regeneration means for approximately regenerating said data from said compressed signal.

21. An apparatus in accordance with claim 20 wherein said memory means further comprises characteristic measure memory means for storing values of the characteristic measures of codebook vectors.

22. An apparatus in accordance with claim 20 wherein said memory means further comprises distance matrix memory means for storing values of the distances between codebook vectors.

23. An apparatus for compressing data in the form of an input vector into an identification code of one of a set of codebook vectors, said apparatus comprising:

(a) input means for receiving the input means for storing the input data vector and for storing codebook vectors, (b) memory means connected to the input means for storing the input data vector and for storing codebook vectors, (d) vector processor means connected to the memory means for calculating the value of a characteristic measure for an input vector; identifying a reference codebook vector, $A_j$, having a value of the characteristic measure which satisfies a first criterion; computing a distance, $h_{I,j}$, between the input vector and the reference codebook vector $A_j$; identifying a subset, S, of codebook vectors for which a measure of the codebook vectors satisfies a second criterion with respect to the reference vector; and selecting a codebook vector from the subset S which closely matches the input vector, (e) output means connected to the vector processor means for generating an output signal representative of the identification code of the closely matching codebook vector.

* * * * *